(12) United States Patent
Lee

(10) Patent No.: US 12,057,254 B2
(45) Date of Patent: Aug. 6, 2024

(54) PLANAR TRANSFORMER EMPLOYING INSULATING STRUCTURE FOR PERFORMANCE IMPROVEMENT

(71) Applicant: Joo Yeol Lee, Gunpo-si (KR)

(72) Inventor: Joo Yeol Lee, Gunpo-si (KR)

(*) Notice: Subject to any disclaimer, the term of this patent is extended or adjusted under 35 U.S.C. 154(b) by 347 days.

(21) Appl. No.: 17/285,618

(22) PCT Filed: Sep. 27, 2019

(86) PCT No.: PCT/KR2019/012552
§ 371 (c)(1),
(2) Date: Apr. 15, 2021

(87) PCT Pub. No.: WO2020/230960
PCT Pub. Date: Nov. 19, 2020

(65) Prior Publication Data
US 2022/0059275 A1     Feb. 24, 2022

(30) Foreign Application Priority Data
May 13, 2019   (KR) .................. 10-2019-0055712

(51) Int. Cl.
*H01F 5/00*     (2006.01)
*H01F 27/26*    (2006.01)
(Continued)

(52) U.S. Cl.
CPC ....... *H01F 27/2804* (2013.01); *H01F 27/263* (2013.01); *H01F 27/324* (2013.01);
(Continued)

(58) Field of Classification Search
CPC ................................................. H01F 27/2804
(Continued)

(56) References Cited

U.S. PATENT DOCUMENTS 8,446,244 B1 *   5/2013   Kuang .................... H01F 30/06
                                                                336/232
8,964,410 B2 *   2/2015   Chang .................... H05K 1/181
                                                                336/200
(Continued)

FOREIGN PATENT DOCUMENTS

CN     105206397 A     12/2015
JP     06-283340 A     10/1994
(Continued)

OTHER PUBLICATIONS

Search Report, mailed Feb. 13, 2020, for International Application No. PCT/KR2019/012552.
(Continued)

*Primary Examiner* — Ronald Hinson
(74) *Attorney, Agent, or Firm* — LRK PATENT LAW FIRM

(57) ABSTRACT

A planar transformer employing an insulating structure for performance improvement includes: a pair of ferrite cores (110) including an upper core (110-1) and a lower core (110-2); a printed circuit board (120), which is disposed between the pair of ferrite cores (110), one end of which has primary via holes (121) electrically connecting primary coil patterns, and the other end of which has secondary via holes (123) electrically connecting secondary coil patterns; an insulating block (130-1) for receiving one side of the pair of ferrite cores (110); and an insulating base (130-2) disposed in the pair of ferrite cores (110) and fittedly coupled to the insulating block (130-1), wherein the insulating block (130-1) and the insulating base (130-2) receive a given region of the printed circuit board (120) at one side at which the secondary via holes (123) is disposed.

7 Claims, 15 Drawing Sheets

(51) Int. Cl.
*H01F 27/28* (2006.01)
*H01F 27/32* (2006.01)
*H05K 1/11* (2006.01)
*H05K 1/16* (2006.01)

(52) U.S. Cl.
CPC ............ *H05K 1/115* (2013.01); *H05K 1/165* (2013.01); *H01F 2027/2819* (2013.01); *H05K 2201/086* (2013.01)

(58) Field of Classification Search
USPC ....................................................... 336/200
See application file for complete search history.

(56) References Cited

U.S. PATENT DOCUMENTS

| 2001/0042905 | A1* | 11/2001 | Katzir | H01F 27/324 438/106 |
| 2002/0191379 | A1* | 12/2002 | Wildrick | H01R 12/7088 361/736 |
| 2004/0032313 | A1* | 2/2004 | Ferencz | H01F 27/266 336/200 |
| 2012/0002387 | A1* | 1/2012 | Park | H05B 41/02 361/679.01 |
| 2013/0099885 | A1* | 4/2013 | Park | H01F 27/306 336/170 |
| 2014/0167901 | A1* | 6/2014 | Persson | H01F 27/323 336/200 |
| 2015/0364245 | A1* | 12/2015 | Jang | H01F 27/2804 336/208 |
| 2016/0078996 | A1* | 3/2016 | Li | H01F 27/263 336/200 |
| 2017/0271074 | A1* | 9/2017 | Chou | H01F 27/2852 |
| 2018/0144858 | A1* | 5/2018 | Oguchi | H01F 27/2823 |
| 2019/0027293 | A1* | 1/2019 | Cheon | H01F 27/2804 |

FOREIGN PATENT DOCUMENTS

| KR | 10-2001-0005144 A | 1/2001 |
| KR | 20-2009-0007062 U | 7/2009 |
| KR | 10-1153521 B1 | 6/2012 |
| KR | 10-2015-0144261 A | 12/2015 |
| KR | 10-1610339 B1 | 4/2016 |
| KR | 10-2017-0142261 A | 12/2017 |

OTHER PUBLICATIONS

Written Opinion, mailed Feb. 13, 2020, for International Application No. PCT/KR2019/012552.

CIPO Office Action, dated Nov. 1, 2023, for Chinese Patent Application No. 201980050465.9 which corresponds to the above-identified U.S. application.

* cited by examiner (a)

(b)

(a)

(b)

(c)

(a)

(b)

(a)

(b)

(a)

(b)

(a)

(b)

PLANAR TRANSFORMER EMPLOYING INSULATING STRUCTURE FOR PERFORMANCE IMPROVEMENT

CROSS-REFERENCE TO RELATED APPLICATIONS

The present application is a U.S. National Phase entry from International Application No. PCT/KR2019/012552, filed Sep. 27, 2019, which claims priority to Korean Patent Application No. 10-2019-0055712, filed May 13, 2019, the disclosure of which is incorporated by reference herein in their entirety.

TECHNICAL FIELD

The present invention relates to a planar transformer employing an insulating structure for performance improvement, and more particularly, to a planar transformer employing an insulating structure for performance improvement that is capable of ensuring an insulation distance between a primary part and secondary via holes of a printed circuit board through a separate insulating block, while not extending the lengths of the coil patterns formed on the printed circuit board.

BACKGROUND ART

A charger for charging a battery for a mobile device receives a commercial voltage supplied to a house, converts the received voltage into a voltage adequate for the charge of the battery, and charges the battery. In this case, the commercial voltage supplied to the house is an alternating current voltage of 220 V, and the voltage for the charge of the battery is 5 V. Accordingly, the charger steps down the commercial voltage of 220 V to voltages 5/9/12/20 V, converts the stepped down voltage into a direct current voltage, and charges the battery. The conversion of the commercial voltage of 220 V into the lower voltages 5/9/12/20 V in the charger is carried out by means of a transformer.

To perform the conversion, the transformer includes primary winding to which the commercial voltage is applied and secondary winding from which a lower voltage than the commercial voltage is outputted. If the alternating current voltage flows to the primary winding, the alternating current voltage inducedly flows to the secondary winding, and loads are connected to two secondary pin terminals connected to the secondary winding, so that the loads receive the electric current flowing to the secondary pin terminals and thus operate.

On the other hand, the transformer has been developed to achieve miniaturization and lightweight, and to obtain the electrical stability in the operation process of the transformer, accordingly, a given distance between a primary part and a secondary part has to be maintained, which undesirably causes limitations in the miniaturization of the transformer. To solve the problems, there is provided a conventional transformer as disclosed in Korean Patent Application Laid-open No. 10-2017-0142261 entitled "charger transformer having improved insulating structure", thereby ensuring an insulation distance and miniaturization of the transformer. In this case, the thickness of the transformer is reduced, but the whole region of the transformer is increased (that is, the lengths of the coil patterns formed on a printed circuit board are increased), thereby failing to achieve perfect miniaturization of the transformer.

Accordingly, there is a need to develop a new transformer capable of ensuring the electrical stability thereof and miniaturizing the whole size thereof.

DISCLOSURE

Technical Problem

Accordingly, the present invention has been made in view of the above-mentioned problems occurring in the related art, and it is an object of the present invention to provide a planar transformer that is capable of ensuring an insulation distance between a primary part (ferrite cores) and secondary via holes of a printed circuit board.

It is another object of the present invention to provide a planar transformer that is capable of reducing the resistance component thereof to thus enhance the efficiency thereof and capable of miniaturizing the whole size thereof.

It is yet another object of the present invention to provide a planar transformer that is capable of allowing an insulating block and an insulating base which ensure an insulation distance to be surroundingly fitted to at least given regions of one pair of ferrite cores, while the insulating block and the insulating base are being fitted to each other, thereby enhancing the coupling force among the components thereof.

The technical problems to be achieved through the present invention are not limited as mentioned above, and other technical problems not mentioned herein will be obviously understood by one of ordinary skill in the art through the following description.

Technical Solution

To accomplish the above-mentioned objects, according to the present invention, there is provided a planar transformer employing an insulating structure for performance improvement, including: a pair of ferrite cores constituted of an upper core and a lower core; a printed circuit board disposed between the pair of ferrite cores and having primary via holes formed on one end thereof in such a manner as to be electrically connected to primary coil patterns and secondary via holes formed on the other end thereof in such a manner as to be electrically connected to secondary coil patterns; an insulating block for accommodating one side of the pair of ferrite cores; and an insulating base disposed at the inside of the pair of ferrite cores in such a manner as to be fitted to the insulating block, wherein the insulating block and the insulating base accommodate a given region of the printed circuit board on one side where the secondary via holes are formed.

According to the present invention, the insulating base includes: a first insulating base surface coming into contact with middle legs of the pair of ferrite cores; and second insulating base surfaces extended from the first insulating base surface in such a manner as to come into contact with top and underside of the printed circuit board.

According to the present invention, the insulating block further includes first insulating block surfaces inserted into one side of the pair of ferrite cores in such a manner as to be fitted to the second insulating base surfaces.

According to the present invention, wherein the insulating block further includes a second insulating block surface inserted into one side of the pair of ferrite cores in such a manner as to accommodate given portions of the exposed surfaces of the upper core and the lower core to the outside.

According to the present invention, the upper core and the lower core each include an accommodation surface formed on the inner side surface onto which the printed circuit board is located in such a manner as to seat the second insulating base surfaces and the first insulating block surfaces fitted to each other thereonto.

According to the present invention, the shortest linear distance from the outer surfaces of the middle legs to the secondary via holes is shorter than 7 mm.

According to the present invention, the insulating block further includes a third insulating block surface adapted to connect the first insulating block surfaces and the second insulating block surface to each other, and the third insulating block surface has a hole formed thereon to allow a given region of the printed circuit board on which the secondary via holes are formed to be exposed to the outside of the pair of ferrite cores.

Advantageous Effects

According to the present invention, the transformer is configured to allow the insulating block and the insulating base to be fitted thereto, so that the transformer can be miniaturized and the insulation distance of at least 7 mm between the primary side and the secondary side can be ensured, without any extension of the lengths of the coil patterns formed on the printed circuit board and the length of the printed circuit board.

In addition, as the lengths of the coil patterns formed on the printed circuit board are not extended, the resistance component is reduced to enhance the efficiency of the transformer, and further, the whole size of the product is miniaturized to thus reduce the manufacturing cost of the product.

Moreover, the transformer according to the present invention provides the electrical stability and firmly couples the insulating block and the insulating base to each other to enable the miniaturization of the product, so that the components of the transformer can be firmly fastened to one another, without any additional adhesive member.

The effects of the invention are not limited as mentioned above, and it should be understood that the effects of the invention include all effects inferable from the detailed description and claims of the present invention.

EXPLANATIONS ON REFERENCE NUMERALS

Figure 1:
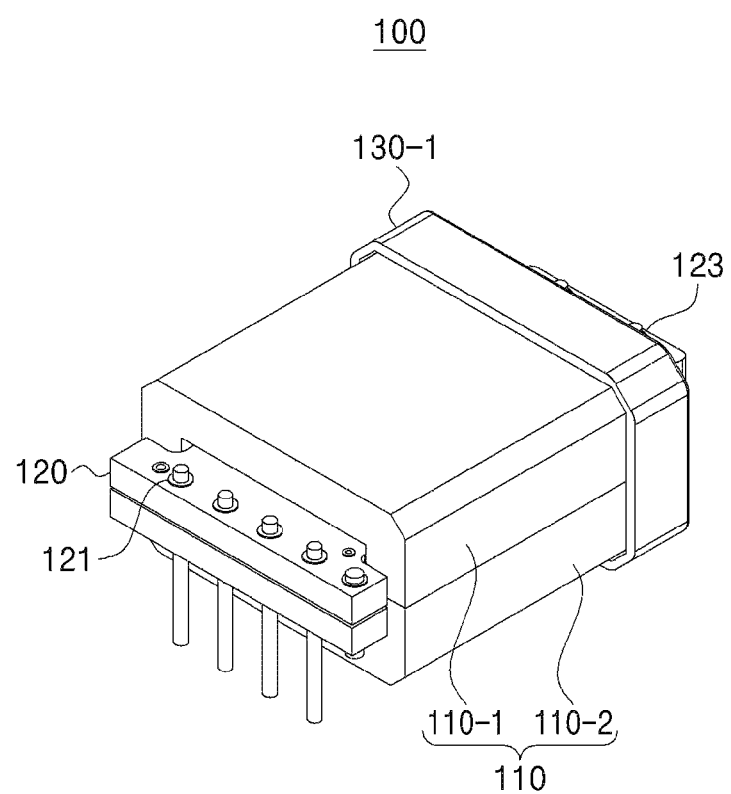
FIG. 1 is a perspective view showing a planar transformer employing an insulating structure for performance improvement according to a first embodiment of the present invention.

100: planar transformer
110: ferrite cores
110-1: upper core 110-2: lower core
111: upper core side surface
113: lower core side surface
112: middle leg
114: first outer leg 115: second outer leg
116: accommodation surface
120: printed circuit board
121: primary via hole 123: secondary via hole
130-1: insulating block 130-2: insulating base
131: outer insulating block surface
132: inner insulating block surface
133: outer insulating base surface
134: inner insulating base surface
135: first insulating base surface
136: second insulating base surface
137: first insulating block surface
138: second insulating block surface
139: third insulating block surface
147: first lead pin 149: second lead pin
150: coil patterns 151: current density

BEST MODE FOR INVENTION

Hereinafter, embodiments of the present invention will be disclosed in detail with reference to the attached drawings. Objects, characteristics and advantages of the present invention will be more clearly understood from the detailed description as will be described below and the attached drawings. Before the present invention is disclosed and described, however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. In the description, the corresponding parts in the embodiments of the present invention are indicated by corresponding reference numerals.

All terms used herein, including technical or scientific terms, unless otherwise defined, have the same meanings which are typically understood by those having ordinary skill in the art. The terms, such as ones defined in common dictionaries, should be interpreted as having the same meanings as terms in the context of pertinent technology, and should not be interpreted as having ideal or excessively formal meanings unless clearly defined in the specification. Terms used in this application are used to only describe specific exemplary embodiments and are not intended to restrict the present invention. An expression referencing a singular value additionally refers to a corresponding expression of the plural number, unless explicitly limited otherwise by the context.

In this application, terms, such as "comprise", "include", or "have", are intended to designate those characteristics, numbers, steps, operations, elements, or parts which are described in the specification, or any combination of them that exist, and it should be understood that they do not preclude the possibility of the existence or possible addition of one or more additional characteristics, numbers, steps, operations, elements, or parts, or combinations thereof.

Hereinafter, the present invention will be disclosed in detail with reference to the attached drawings.

Figure 2:
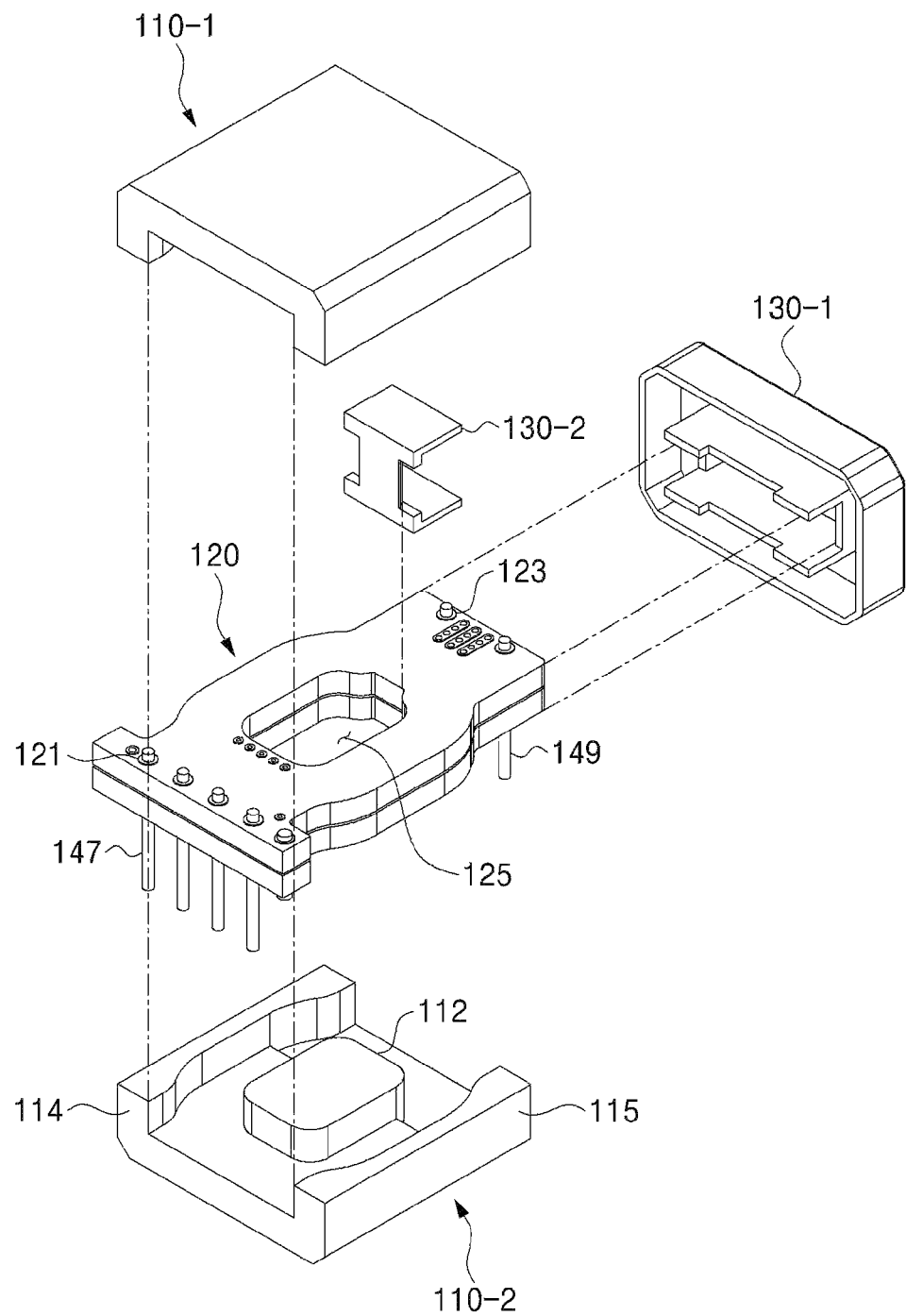
FIG. 2 is an exploded top perspective view showing the planar transformer employing an insulating structure for performance improvement according to the first embodiment of the present invention.
Figure 3:
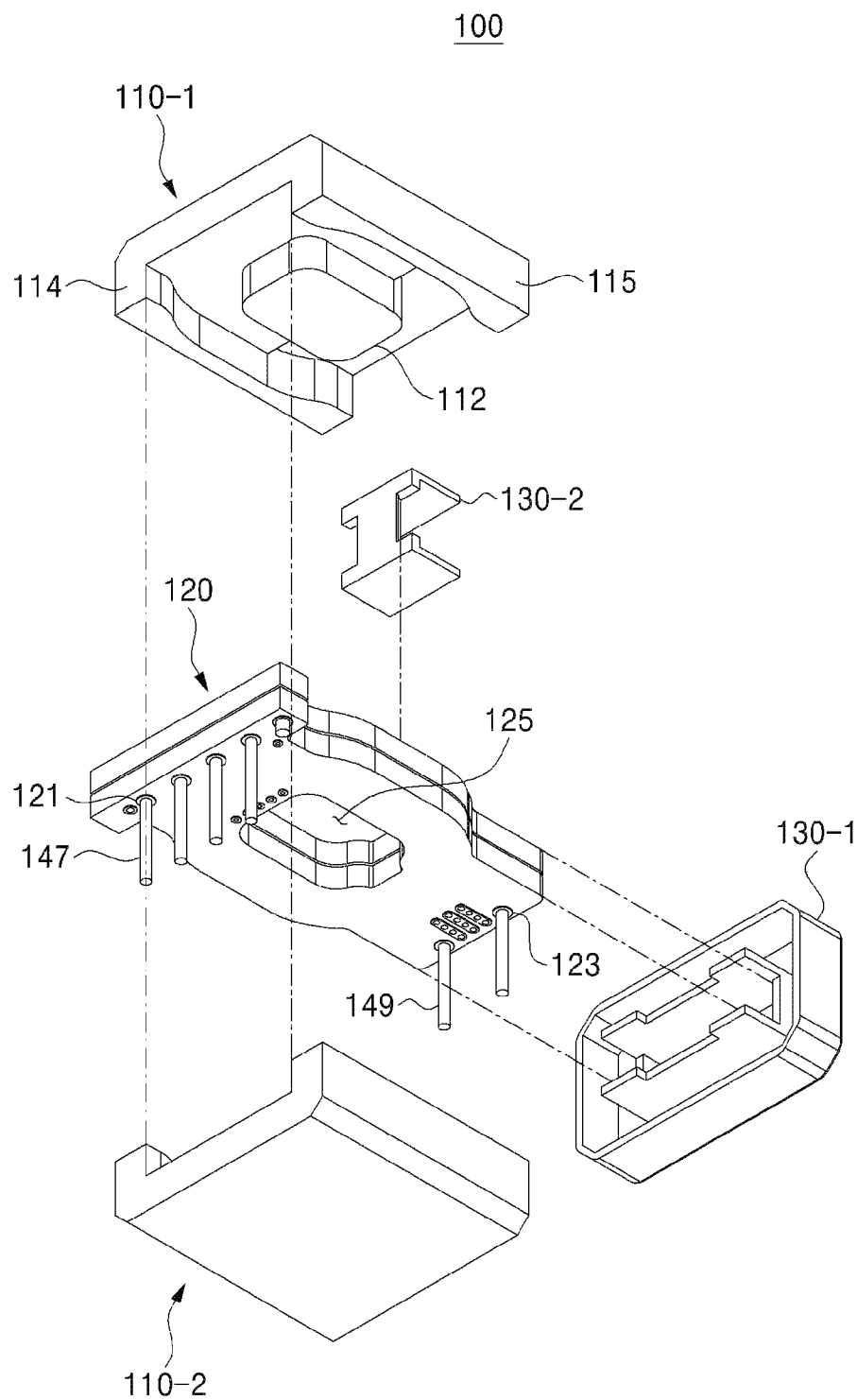
FIG. 3 is an exploded bottom perspective view showing the planar transformer employing an insulating structure for performance improvement according to the first embodiment of the present invention.

FIG. 1 is a perspective view showing a planar transformer 100 employing an insulating structure for performance improvement according to a first embodiment of the present invention, FIG. 2 is an exploded top perspective view showing the planar transformer 100 employing an insulating structure for performance improvement according to the first embodiment of the present invention, and FIG. 3 is an exploded bottom perspective view showing the planar transformer 100 employing an insulating structure for performance improvement according to the first embodiment of the present invention.

Referring to FIGS. 1 to 3, the planar transformer 100 (hereinafter, referred to as transformer) employing an insulating structure for performance improvement according to the first embodiment of the present invention includes a pair of ferrite cores 110 constituted of an upper core 110-1 and a lower core 110-2 that are electromagnetically coupled to each other, a printed circuit board 120 disposed in an internal space formed by the pair of ferrite cores 110, and an insulating block 130-1 and an insulating base 130-2 for ensuring an insulation distance between the pair of ferrite cores 110 and the printed circuit board 120.

The pair of ferrite cores 110 forms the internal space in which a conversion process of stepping up or down the voltage inputted through the transformer 100 is carried out. To do this, when the pair of ferrite cores 110 is vertically cut down, the upper core 110-1 and the lower core 110-2 each include a first outer leg 114, a middle leg 112, and a second outer leg 115 to thus have the shape of E lying on the floor, and further, the upper core 110-1 and the lower core 110-2 are open in forward and backward directions to thus allow given regions of the printed circuit board 120 to be exposed therethrough. However, the upper core 110-1 and the lower core 110-2 may be freely shaped, without being limited thereto. For example, the upper core 110-1 and the lower core 110-2 may have sectional shapes of E-I and I-I.

According to the present invention, the forward direction indicates a direction toward one side in which the insulating block 130-1 is not disposed and the backward direction indicates a direction toward one side in which the insulating block 130-1 is disposed, with respect to the transformer 100 as shown in FIG. 1.

The pair of ferrite cores 110 is made of a ferrite material so that the ferrite cores 110 can be electromagnetically coupled to each other. As the ferrite cores 110 of the transformer 100 are made of the ferrite material, like this, they can use the characteristics of the magnetic material according to the switching frequency of a power circuit within a frequency of hundreds of kHz. As an available frequency band is raised, further, the transformer 100 can be miniaturized and lightweight when compared to the capacity in which power conversion can be performed. Further, a power loss rate becomes low to enable eddy current loss in a high frequency band to be reduced.

The printed circuit board 120 includes primary coil patterns and secondary coil patterns for stepping up or down the voltage. In specific, the induced electromotive force generated from the primary coil patterns through the current flowing to primary via holes 121 formed on one end of the printed circuit board 120 is induced to the secondary coil patterns and is then outputted to secondary via holes 123 formed on the other end of the printed circuit board 120.

So as to allow the voltage to be inputted and outputted to and from the primary via holes 121 and the secondary via holes 123, like this, the printed circuit board 120 includes first lead pins 147 electrically connected to the primary via holes 121 on one end in which the primary via holes 121 are formed and second lead pins 149 electrically connected to the secondary via holes 123 on the other end in which the secondary via holes 123 are formed.

Further, the printed circuit board 120 is formed at the interior of the pair of ferrite cores 110, and accordingly, the printed circuit board 120 has an insertion hole 125 adapted to insert the middle legs 112 of the pair of ferrite cores 110 thereinto.

According to the present invention, though one printed circuit board 120 is provided, but at least two or more printed circuit boards 120 having coil patterns may be laid on top of each other.

To provide electrical stability for the transformer 100, the insulating block 130-1 and the insulating base 130-2 are coupled to the pair of ferrite cores 110 and the printed circuit board 120, thereby ensuring an insulation distance between the pair of ferrite cores 110 and the secondary via holes 123. In this case, the insulation distance is the shortest distance from the exposed points of the pair of ferrite cores 110 as a primary part to the secondary via holes 123 as a secondary part, and a distance measured along the insulation surface has to be longer than the standard insulation distance.

In specific, the insulating block 130-1 accommodates one side of the pair of ferrite cores 110, and the insulating base 130-2 has the shape of C in such a manner as to be located in the pair of ferrite cores 110. Further, the insulating base 130-2 is fitted to the insulating block 130-1. In specific, the insulating block 130-1 and the insulating base 130-2 surroundingly accommodate a given region of the printed circuit board 120 in which the secondary via holes 123 are formed, so that the exposed points of the pair of ferrite cores 110 can be distant from the secondary via holes 123. Accordingly, the standard insulation distance between the primary part and the secondary part can be ensured even in the printed circuit board 120 having a relatively short length, so that there is no need to increase the lengths of the coil patterns so as to ensure the standard insulation distance.

Up to now, the components of the transformer 100 according to the first embodiment of the present invention have been described, and hereinafter, the specific shapes of the insulating block 130-1 and the insulating base 130-2 capable of ensuring the standard insulation distance between the primary part and the secondary part in the transformer 100 will be explained.

Figure 4:
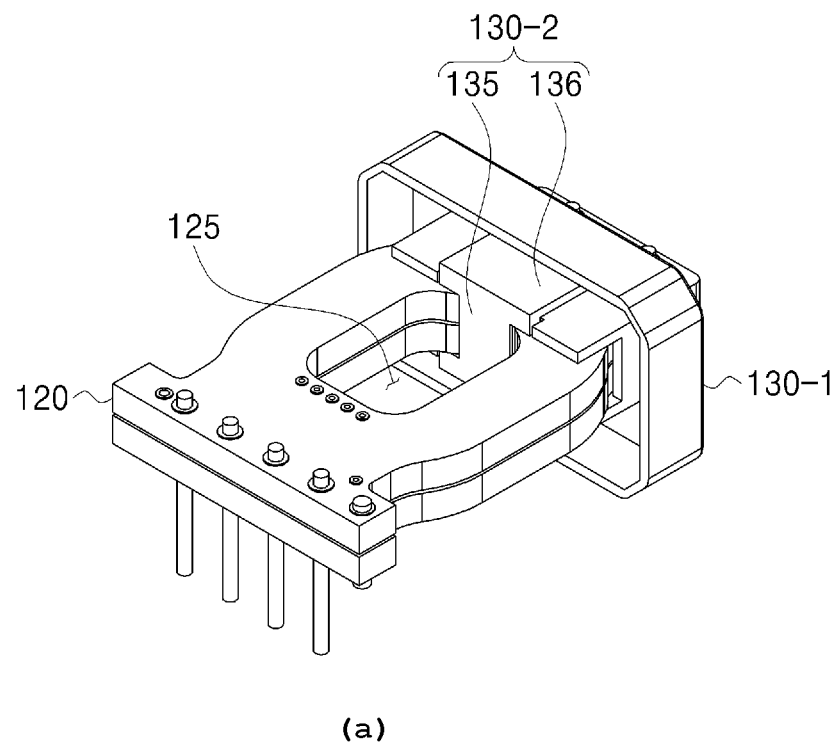
FIG. 4 illustrates perspective views (a) and (b) showing coupling methods between an insulating block and an insulating base in the planar transformer according to the first embodiment of the present invention.
Figure 4:
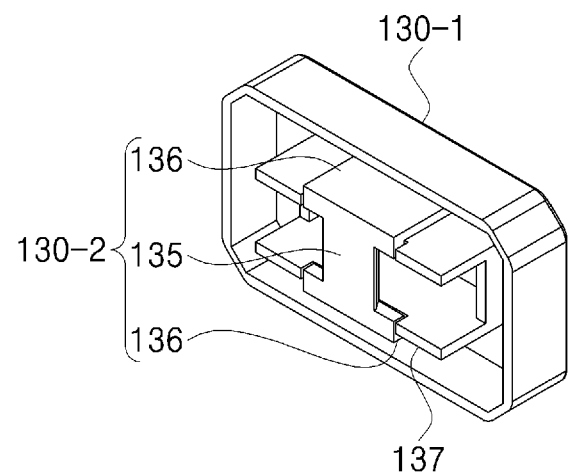
Figure 5:
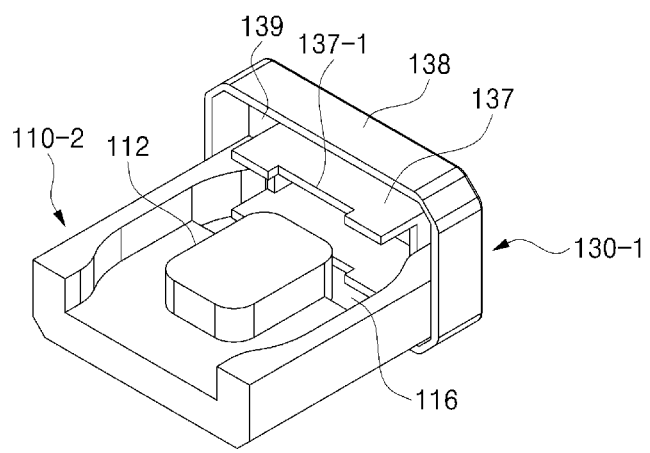
FIG. 5 illustrates perspective views (a) to (c) showing coupling methods between the insulating block and a lower core of the planar transformer according to the first embodiment of the present invention.
Figure 5:
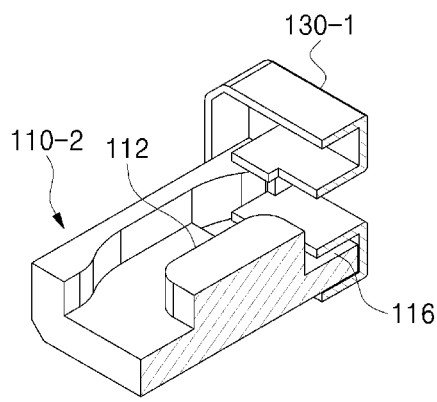
Figure 5:
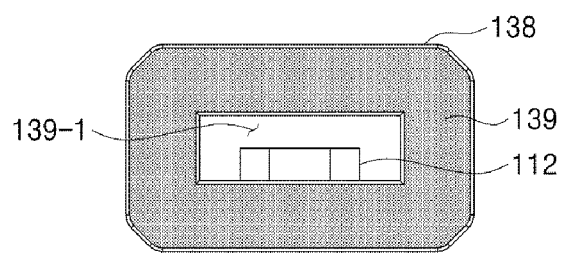
Figure 6:
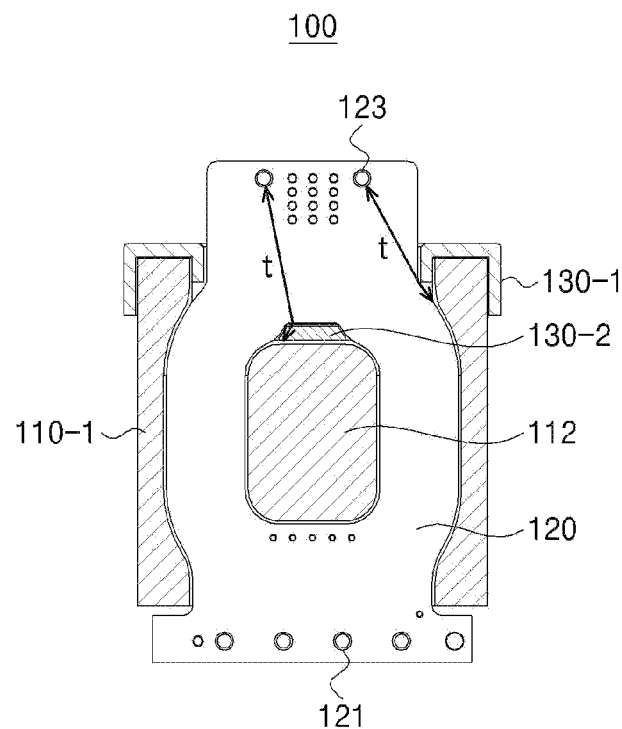
FIG. 6 is a sectional plan view showing the shortest insulation distance between one pair of ferrite cores and secondary via holes in the planar transformer according to the first embodiment of the present invention.

FIG. 4 illustrates perspective views (a) and (b) showing coupling methods between the insulating block 130-1 and the insulating base 130-2 in the transformer 100 according to the first embodiment of the present invention, FIG. 5 illustrates perspective views (a) to (c) showing coupling methods between the insulating block 130-1 and the lower core 110-2 of the transformer 100 according to the first embodiment of the present invention, and FIG. 6 is a sectional plan view showing the shortest insulation distance between the pair of ferrite cores 110 and the secondary via holes 123 in the transformer 100 according to the first embodiment of the present invention.

Referring to FIGS. 4(a) and (b), the insulating block 130-1 and the insulating base 130-2 are cross-coupled to each other, and in the cross-coupled space, the given region of the printed circuit board 120 is accommodated. In specific, the insulating base 130-2 includes a first insulating base surface 135 coming into contact with the middle legs 112 of the pair of ferrite cores 110 and one surface in which the insertion hole 124 of the printed circuit board 120 is formed and second insulating base surfaces 136 extended from the first insulating base surface 135 in such a manner as to come into contact with top and underside of the printed circuit board 120. That is, the CE-shaped insulating base 130-2 is located on one surface with which the middle legs 112 of the pair of ferrite cores 110 and the printed circuit board 120 come into contact, thereby ensuring the insulation distance.

Further, the insulating block 130-1 includes first insulating block surfaces 137 inserted into one side of the pair of ferrite cores 110 in such a manner as to be fitted to the second insulating base surfaces 136. In this case, the first insulating block surfaces 137 have given grooves 137-1 adapted to be firmly coupled to the second insulating base surfaces 136, that is, the insulating base 130-2.

That is, as shown in FIG. 5(a), the grooves 137-1 are formed on the first insulating block surfaces 137 of the insulating block 130-1. Further, the insulating block 130-1 includes a second insulating block surface 138 adapted to accommodate portions of the exposed surfaces of the upper core 110-1 and the lower core 110-2, so that the insulating block 130-1 can be firmly coupled to the insulating base 130-2, without any separate adhesive member (e.g., adhesive, tape, etc.), thereby ensuring the insulation distance.

Referring to FIG. 5(b), further, when the coupled shape of the transformer 100 is vertically cut off, an accommodation surface 116 is formed on the inner side surface of the lower core 110-2 so as to allow the insulating block 130-1 and the insulating base 130-2 firmly coupled to each other to be seated onto the lower core 110-2. In specific, the lower core 110-2 has a relatively small thickness at the region in which the accommodation surface 116 is formed, so that the insulating block 130-1 can accommodate the lower core 110-2 more easily.

Though the lower core 110-2 is shown in FIG. 5b, but of course, an accommodation surface 116 may be formed on the inner side surface of the upper core 110-2 to accommodate the insulating block 130-1.

Referring to FIG. 5(c), when the coupled shape of the transformer 100 is viewed at the rear side thereof, the insulating block 130-1 further includes a third insulating block surface 139 adapted to connect the first insulating block surfaces 137 and the second insulating block surface 138 to each other. The third insulating block surface 139 has a hole 139-1 formed thereon to allow the printed circuit board 120 on which the secondary via holes 123 are formed to be exposed to the outside of the pair of ferrite cores 110, so that just through the fitting of the insulating block 130-1 to the pair of ferrite cores 110, the pair of ferrite cores 110 can be stably fixed to the insulating block 130-1.

Referring to FIG. 6, the printed circuit board 120 is located between the pair of ferrite cores 110, and the first outer legs 114, the middle legs 112, and the second outer legs 115 of the pair of ferrite cores 110 are electromagnetically coupled to each other to provide moving paths of magnetic fluxes. In this case, the middle legs 112 are inserted into the insertion hole 125 of the printed circuit board 120 to form paths for relaying the magnetic fluxes of the primary side and the secondary side. That is, the input current applied to the primary via holes 121 generates the electromotive force through the primary coil patterns in the printed circuit board 120, and next, the electromotive force is induced to the secondary coil patterns in the printed circuit board 120 and is then outputted to the secondary via holes 123.

So as to maintain the performance of the transformer 100 and to achieve the miniaturization of the transformer 100, the insulating base 130-2 is disposed at the inside of the pair of ferrite cores 110, and the insulating block 130-1 at the outside of the pair of ferrite cores 110, so that the insulating base 130-2 and the insulating block 130-1 have the shape of E: to thus face each other, thereby being firmly fitted to each other.

Meanwhile, the insulating block 130-1 and the insulating base 130-2 are disposed to insulate given portions of the middle legs 112, thereby ensuring the insulation distance through the bypassing length of the insulating means. Accordingly, the shortest insulation distance t from the outer surfaces of the middle legs 112 of the upper core 110-1 and the lower core 110-2 to the secondary via holes 123 can be a linear distance shorter than 7 mm. As a result, the size of the printed circuit board 120 can be relatively smaller than that in the conventional transformer.

Up to now, the explanation of the transformer 100 according to the first embodiment of the present invention has been given. According to the present invention, the shortest insulation distance t between the pair of ferrite cores 110 and the secondary via holes 123 is ensured by means of the insulating block 130-1 and the insulating base 130-2 configured to surround the given region of the printed circuit board 120, thereby minimizing the lengths of the coil patterns formed on the printed circuit board 120. Further, the whole size of the transformer 100 can be miniaturized, and the performance of the transformer 100 can be improved.

Hereinafter, an explanation of another transformer 100 capable of ensuring the insulation distance will be given.

Figure 7:
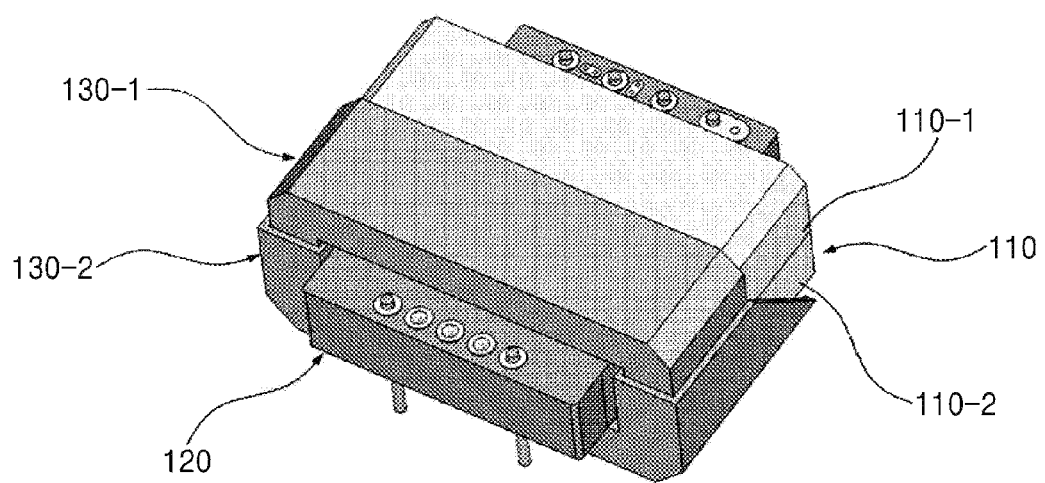
FIG. 7 is a perspective view showing a planar transformer employing an insulating structure for performance improvement according to a second embodiment of the present invention.
Figure 8:
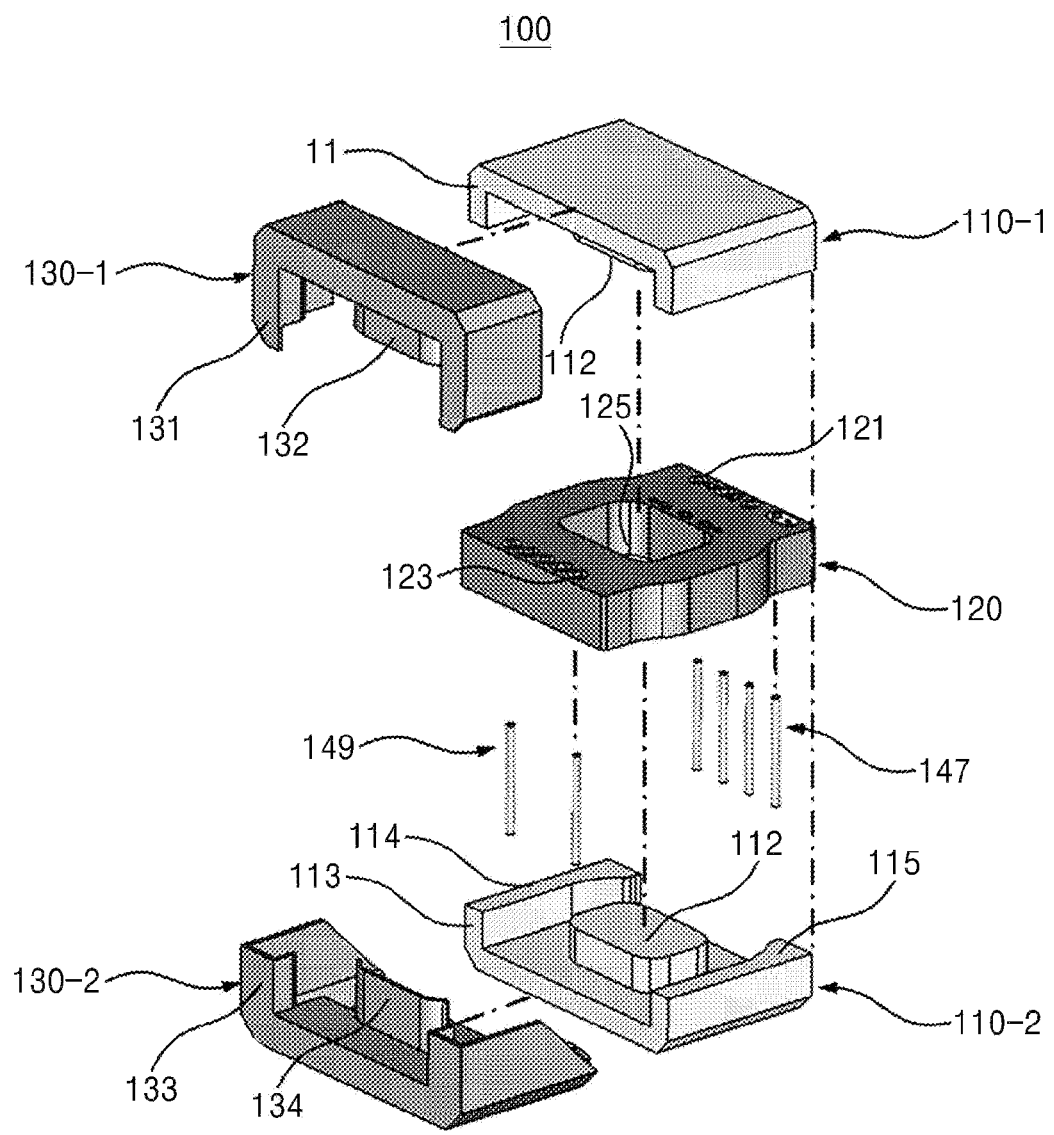
FIG. 8 is an exploded top perspective view showing the planar transformer employing an insulating structure for performance improvement according to the second embodiment of the present invention.
Figure 9:
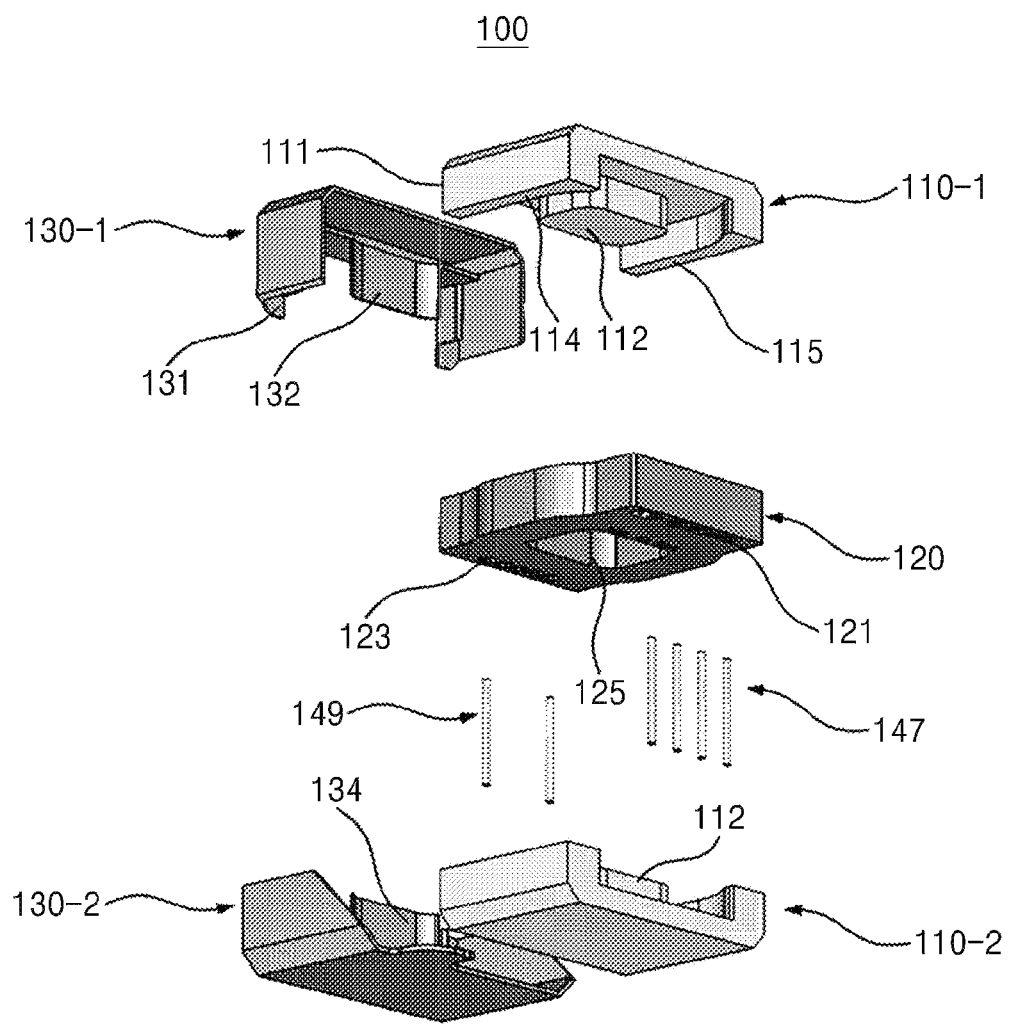
FIG. 9 is an exploded bottom perspective view showing the planar transformer employing an insulating structure for performance improvement according to the second embodiment of the present invention.

FIG. 7 is a perspective view showing a planar transformer 100 employing an insulating structure for performance improvement according to a second embodiment of the present invention, FIG. 8 is an exploded top perspective view showing the planar transformer 100 employing an insulating structure for performance improvement according to the second embodiment of the present invention, and FIG. 9 is an exploded bottom perspective view showing the planar transformer 100 employing an insulating structure for performance improvement according to the second embodiment of the present invention.

Referring to FIGS. 7 to 9, the transformer 100 according to the first embodiment of the present invention includes a pair of ferrite cores 110 constituted of an upper core 110-1 and a lower core 110-2 that are electromagnetically coupled to each other, a printed circuit board 120 disposed in an internal space formed by the pair of ferrite cores 110, and an insulating block 130-1 and an insulating base 130-2 for insulating the printed circuit board 120.

The pair of ferrite cores 110 forms the internal space in which a conversion process of stepping up or down the voltage inputted through the transformer 100 is carried out. To do this, when the pair of ferrite cores 110 is vertically cut down, the upper core 110-1 and the lower core 110-2 each include a first outer leg 114, a middle leg 112, and a second outer leg 115 to thus have the shape of E lying on the floor, and further, the upper core 110-1 and the lower core 110-2 are open in forward and backward directions to thus allow given regions of the printed circuit board 120 to be exposed therethrough. However, the upper core 110-1 and the lower core 110-2 may be freely shaped, without being limited thereto. For example, the upper core 110-1 and the lower core 110-2 may have the sectional shapes of E-I and I-I.

The pair of ferrite cores 110 is made of a ferrite material so that the ferrite cores 110 can be electromagnetically coupled to each other. As the ferrite cores 110 of the transformer 100 are made of the ferrite material, like this, they can use the characteristics of the magnetic material according to the switching frequency of a power circuit within a frequency of hundreds of kHz. As an available frequency band is raised, accordingly, the transformer 100 can be miniaturized and lightweight when compared to the capacity in which power conversion can be performed. Further, a power loss rate becomes low to enable eddy current loss in a high frequency band to be reduced.

The printed circuit board 120 includes primary coil patterns and secondary coil patterns for stepping up or down the voltage. In specific, the induced electromotive force generated from the primary coil patterns through the current flowing to primary via holes 121 formed on one end of the printed circuit board 120 is induced to the secondary coil patterns and is then outputted to secondary via holes 123 formed on the other end of the printed circuit board 120.

So as to allow the voltage to be inputted and outputted to and from the primary via holes 121 and the secondary via holes 123, like this, the printed circuit board 120 includes first lead pins 147 electrically connected to the primary via holes 121 on one end in which the primary via holes 121 are formed and second lead pins 149 electrically connected to the secondary via holes 123 on the other end in which the secondary via holes 123 are formed.

Further, the printed circuit board 120 is formed at the inside of the pair of ferrite cores 110, and accordingly, the printed circuit board 120 has an insertion hole 125 adapted to insert the middle legs 112 of the pair of ferrite cores 110 thereinto.

According to the present invention, though one printed circuit board 120 is provided, but at least two or more printed circuit boards 120 having coil patterns may be laid on top of each other.

To provide electrical stability for the transformer 100, the insulating block 130-1 and the insulating base 130-2 serve to ensure an insulation distance between the pair of ferrite cores 110 and the secondary via holes 123. In this case, the insulation distance is the shortest distance from the exposed points of the pair of ferrite cores 110 as a primary part to the secondary via holes 123 as a secondary part, and a distance measured along the insulation surface has to be longer than the standard insulation distance.

In specific, the insulating block 130-1 and the insulating base 130-2 are cross-coupled to each other, and the insulating block 130-1 includes an outer insulating block surface 131 for accommodating an upper core side surface 111 to thus ensure the insulation distance and an inner insulating block surface 132 for accommodating a portion of the middle leg 112 of the upper core 110-1 to thus ensure the insulation distance. Further, the insulating base 130-2 includes an outer insulating base surface 133 for accommodating a lower core side surface 113 to thus ensure the insulation distance and an inner insulating base surface 134 for accommodating a portion of the middle leg 112 of the lower core 110-2 to thus ensure the insulation distance.

Further, the outer insulating block surface 131 of the insulating block 130-1 and the outer insulating base surface 133 of the insulating base 130-2 each are spaced apart from the secondary via holes 123 of the printed circuit board 120.

Moreover, the insulating base 130-2 is configured to accommodate the pair of ferrite cores 110 and the insulating block 130-1. In specific, the insulating base 130-2 accommodates the lower core 110-2 in the interior thereof, and next, the insulating block 130-1 in which the upper core 110-1 is accommodated is seated onto top of the insulating base 130-2. That is, the outer insulating block surface 131 and the outer insulating base surface 133 are cross-coupled to each other, and the inner insulating block surface 132 and the inner insulating base surface 134 are cross-coupled to each other, thereby providing the transformer 100 structured very firmly.

Up to now, the explanation of the components of the transformer 100 according to the second embodiment of the present invention has been given. According to the present invention, the insulation distance t between the pair of ferrite cores 110 and the secondary via holes 123 is ensured by means of the insulating block 130-1 and the insulating base 130-2 that are fitted to each other, thereby minimizing the lengths of the coil patterns formed on the printed circuit board 120 and achieving the miniaturization and performance improvement of the transformer 100.

Hereinafter, the structures of the insulating block 130-1 and the insulating base 130-2 capable of ensuring the insulation distance will be explained.

Figure 10:
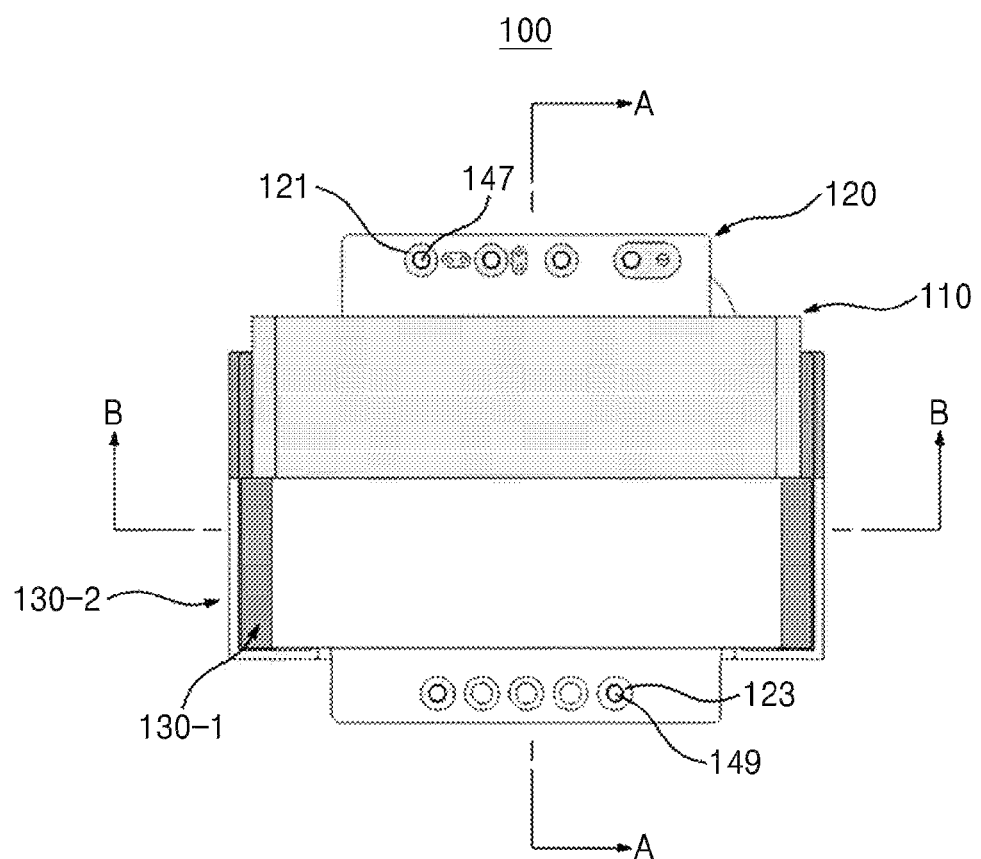
FIG. 10 is a top view showing the planar transformer according to the second embodiment of the present invention.
Figure 11:
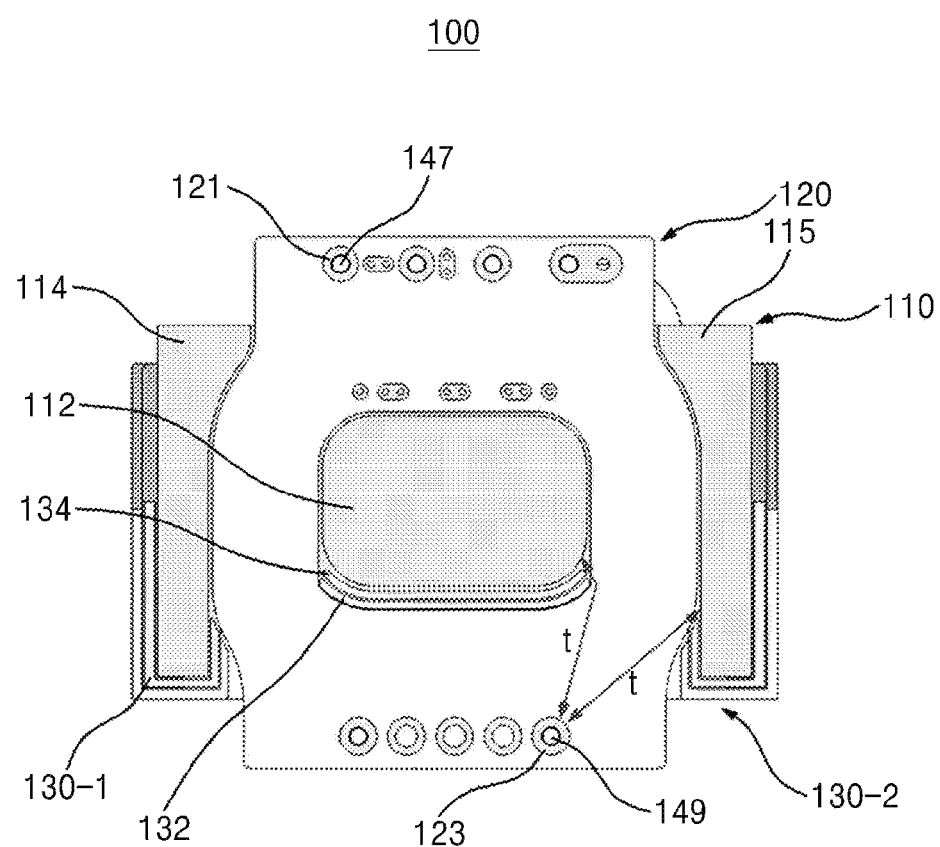
FIG. 11 is a sectional plan view showing the planar transformer according to the second embodiment of the present invention.
Figure 12:
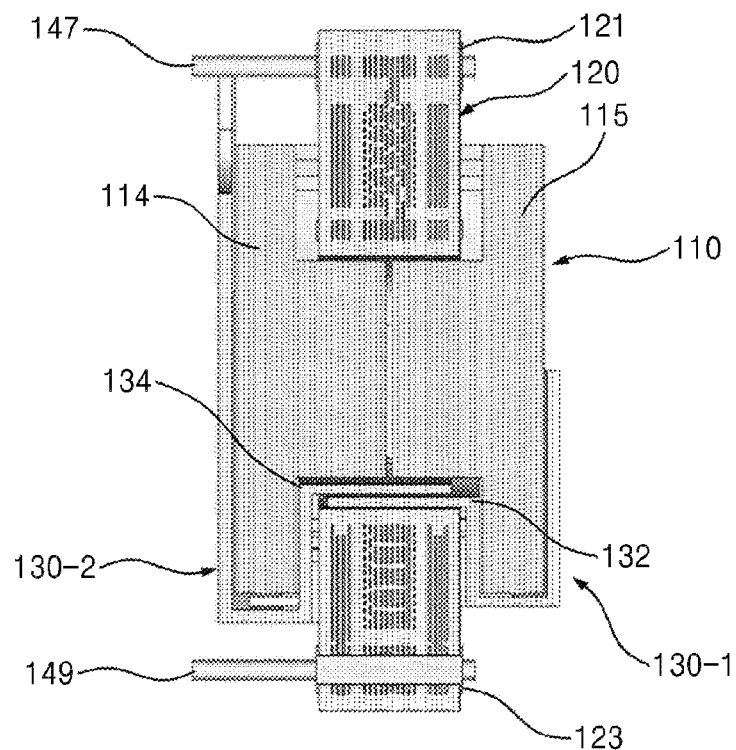
FIG. 12 is a sectional view taken along the line A-A' of the planar transformer of FIG. 10.
Figure 13:
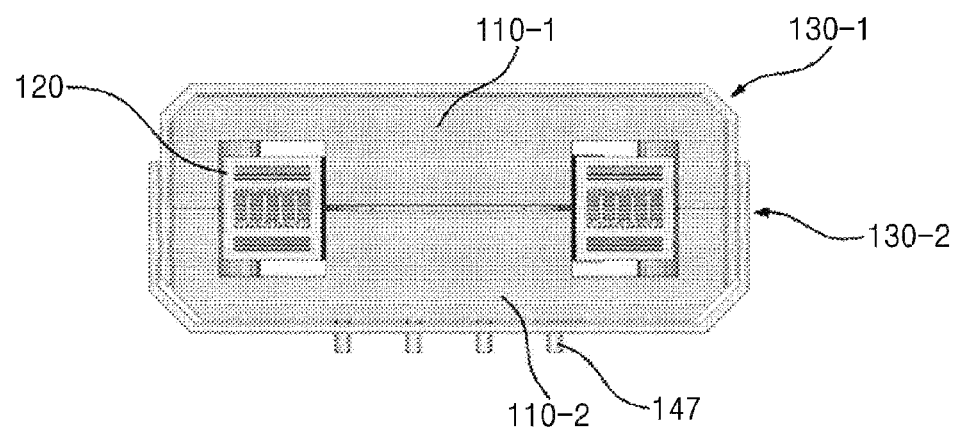
FIG. 13 is a sectional view taken along the line B-B' of the planar transformer of FIG. 10.

FIG. 10 is a top view showing the transformer 100 according to the second embodiment of the present invention, FIG. 11 is a sectional plan view showing the transformer 100 according to the second embodiment of the present invention, FIG. 12 is a sectional view taken along the line A-A' of the transformer 100 of FIG. 10, and FIG. 13 is a sectional view taken along the line B-B' of the transformer 100 of FIG. 10.

Referring to FIGS. 10 to 13, the transformer 100 is configured to locate the printed circuit board 120 between the pair of ferrite cores 110, and the first outer legs 114, the middle legs 112, and the second outer legs 115 of the pair of ferrite cores 110 are electromagnetically coupled to each other to provide the moving paths of magnetic fluxes. In this case, the middle legs 112 are inserted into the insertion hole 125 of the printed circuit board 120 to form paths for relaying the magnetic fluxes of the primary side and the secondary side. That is, the input current applied to the primary via holes 121 generates the electromotive force through the primary coil patterns in the printed circuit board 120, and next, the electromotive force is induced to the secondary coil patterns in the printed circuit board 120 and is then outputted to the secondary via holes 123.

So as to maintain the performance of the transformer 100 and to achieve the miniaturization of the transformer 100, that is, the insulating block 130-1 coupled to the upper core 110-1 and the insulating base 130-2 coupled to the lower core 110-2 are coupled to the printed circuit board 120. That is, the insulating block 130-1 coupled to the upper core 110-1 and the insulating base 130-2 coupled to the lower core 110-2 are coupledly inserted into the insertion hole 125 of the printed circuit board 120. In this process, moreover, the pair of ferrite cores 110, which surrounds the printed circuit board 120, is insulatedly seated onto the printed circuit board 120 by means of the insulating block 130-1 and the insulating base 130-2.

Further, the insulating block 130-1 coupled to the upper core 110-1 is seated onto the interior of the insulating base 130-2 coupled to the lower core 110-2. Next, the outer insulating block surface 131 and the outer insulating base surface 133 are cross-coupled to each other, and the inner insulating block surface 132 and the inner insulating base surface 134 are cross-coupled to each other, so that the transformer 100 can have a firm structure, without being moved by any external force.

Hereinafter, the conventional transformer structure and the transformer structure according to the first embodiment of the present invention will be comparedly explained with reference to FIGS. 14*a* to 17*b*.

Figure 14:
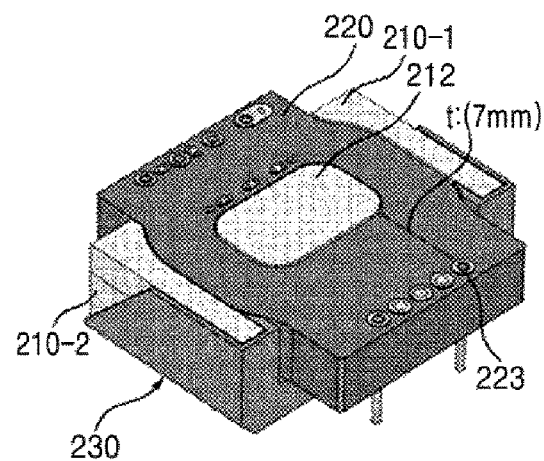
FIG. 14 illustrates sectional plan views (a) and (b) showing the comparison between the insulation distances of a conventional transformer and the transformer according to the first embodiment of the present invention.
Figure 14:
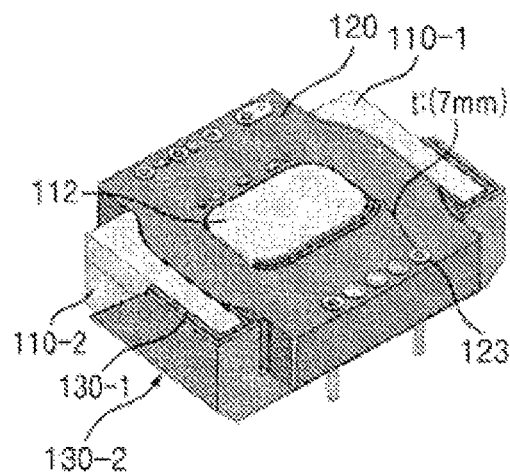

FIG. 14 illustrates sectional plan views (a) and (b) showing the comparison between the insulation distances of a conventional transformer and the transformer 100 according to the first embodiment of the present invention.

FIG. 14(*a*) shows the insulation structure of the conventional transformer, and in the conventional transformer, no insulation distance exists between middle legs 212 of an upper core 210-1 and a lower core 210-2 and secondary via holes 223, so that the shortest insulation distance t between the middle legs 212 and the secondary via holes 223 is a linear distance longer than at least 7 mm.

Contrarily, FIG. 14(*b*) shows the insulation structure of the transformer according to the first embodiment of the present invention, and the insulating block 130-1 and the insulating base 130-2 are disposed to insulate portions of the middle legs 112, thereby ensuring the insulation distance through the bypassing length of the insulating means. Accordingly, the shortest insulation distance t from the outer surfaces of the middle legs 112 of the upper core 110-1 and the lower core 110-2 to the secondary via holes 123 can be a linear distance shorter than 7 mm. That is, the size of the printed circuit board 120 can be relatively smaller than that in the conventional transformer.

Figure 15:
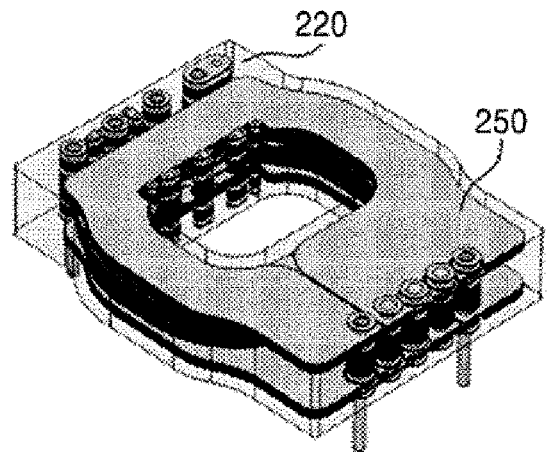
FIG. 15 illustrates perspective views (a) and (b) showing the comparison between the sizes of the secondary coil patterns of the conventional transformer and the transformer according to the first embodiment of the present invention.
Figure 15:
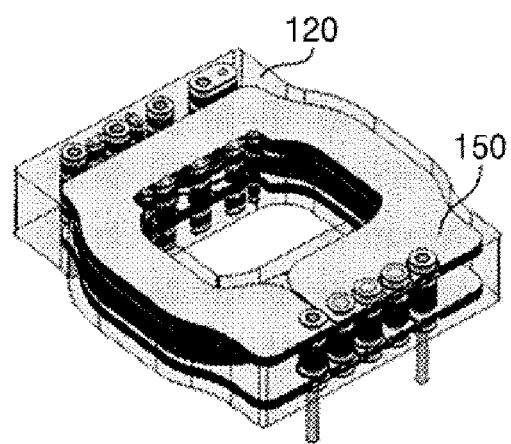

FIG. 15 illustrates perspective views (a) and (b) showing the comparison between the sizes of the secondary coil patterns of the conventional transformer and the transformer 100 according to the first embodiment of the present invention.

FIG. 15(*a*) shows secondary coil patterns 250 formed in a printed circuit board 220 of the conventional transformer 200, and FIG. 15(*b*) shows secondary coil patterns 150 formed in the printed circuit board 120 of the transformer 100 according to the first embodiment of the present invention. In this case, the sizes of the secondary coil patterns 150 according to the first embodiment of the present invention are smaller than those in the conventional transformer 200, so that the transformer 100 according to the first embodiment of the present invention can be more miniaturized than the conventional transformer 200.

Figure 16:
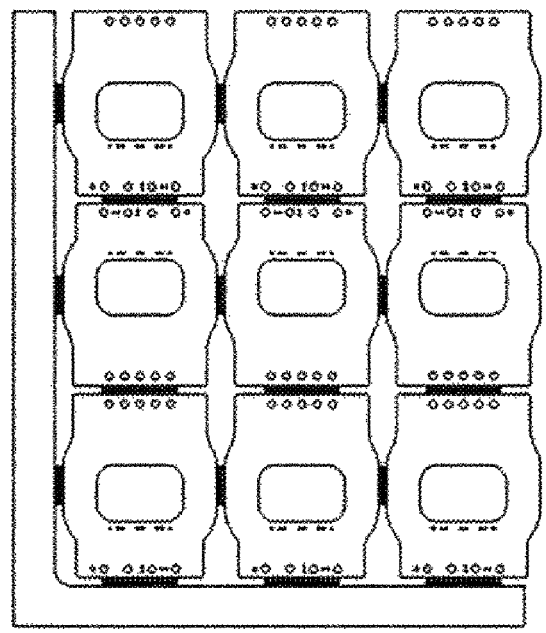
FIG. 16 illustrates top views (a) and (b) showing the comparison between the number of printed circuit boards obtained in the same substrate in the conventional transformer and that in the transformer according to the first embodiment of the present invention.
Figure 16:
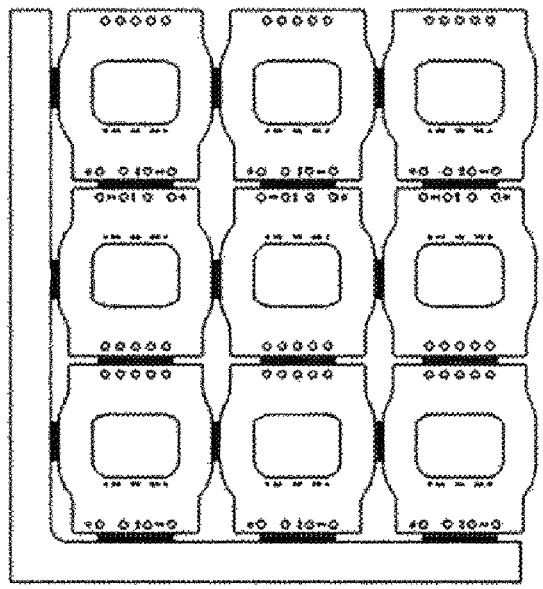

FIG. 16 illustrates top views (a) and (b) showing the comparison between the number of printed circuit boards obtained in the same substrate in the conventional transformer and that in the transformer 100 according to the first embodiment of the present invention.

Referring to FIGS. 16(*a*) and (*b*), a substrate used for making a multi-layered printed circuit board has a size of 1000×1000 mm. In the case of the conventional transformer, as shown in FIG. 16(*a*), about 2,009 printed circuit boards (having the size of 19.15×22.8 mm) can be produced from one substrate, but in the case of the transformer according to the first embodiment of the present invention, as shown in FIG. 16(*b*), about 2,205 printed circuit boards (having the size of 19.15×21.0 mm) can be produced from one substrate.

That is, 196 printed circuit boards can be more produced from the same one substrate, so that the cost reduction of about 10% can be achieved, thereby providing economical advantages.

Figure 17:
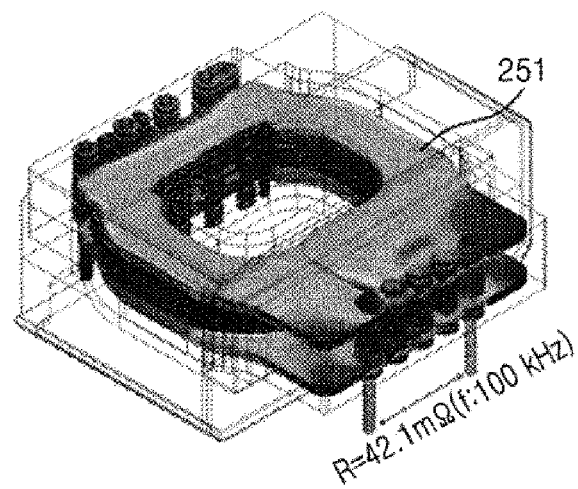
FIG. 17 illustrates perspective views (a) and (b) showing the electrical resistance values of the secondary coil patterns in the conventional transformer and the transformer according to the first embodiment of the present invention.
Figure 17:
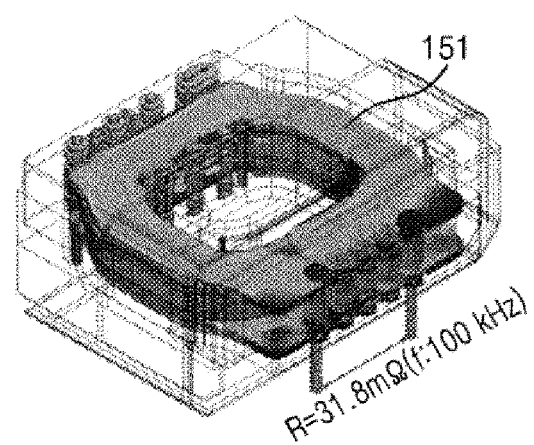

FIG. 17 illustrates perspective views (a) and (b) showing the electric resistance values of the secondary coil patterns in the conventional transformer and the transformer 100 according to the first embodiment of the present invention. The colors in the figures represent temperature distribution of the printed circuit board according to the current density 251.

Referring to FIG. 17(*a*), in the conventional transformer, if it is assumed that the switching frequency of a charger circuit is 100 kHz, an output voltage and an output current are 5V/3A, the electrical resistance component of alternating current is 42.1 mΩ, and if the secondary output power is 15 W, the power loss caused by the electrical resistance of 42.1 mΩ is 378.9 mW.

Referring to FIG. 17(*b*), in the transformer 100 according to the present invention, if it is assumed that the switching frequency of a charger circuit is 100 kHz, an output voltage and an output current are 5V/3A, the electrical resistance component of alternating current is 31.8 mΩ, and if the secondary output power is 15 W, the power loss caused by the electrical resistance of 31.8 mΩ is 286.2 mW. Accordingly, the power loss of the transformer according to the present invention is smaller than that of the conventional transformer.

That is, the transformer 100 according to the first embodiment of the present invention is configured to allow the insulating block 130-1 and the insulating base 130-2 to be fittedly coupled to the pair of ferrite cores 110, so that the power loss reduction of about 25% can be obtained when compared to that of the conventional transformer.

In the above-mentioned description, though the conventional transformer is compared to the transformer according to the first embodiment of the present invention, but of course, it can be understood that the transformer according to the second embodiment of the present invention has the same advantages as mentioned above through the arrangements of the insulating block 130-1 and the insulating base 130-2.

The preferred embodiments of the present invention have been disclosed in the specification and drawings. In the description of the present invention, special terms are used not to limit the present invention and the scope of the present invention as defined in claims, but just to explain the present invention. Therefore, persons skilled in the relevant art can appreciate that many modifications and variations are possible in light of the above teachings. It is therefore intended that the scope of the invention be limited not by this detailed description, but rather by the claims appended hereto.

The invention claimed is:

1. A planar transformer employing an insulating structure for performance improvement, comprising:
    a pair of ferrite cores (110) constituted of an upper core (110-1) and a lower core (110-2);
    a printed circuit board (120) disposed between the pair of ferrite cores (110) and having primary via holes (121) formed on one end thereof in such a manner as to be electrically connected to primary coil patterns and secondary via holes (123) formed on the other end thereof in such a manner as to be electrically connected to secondary coil patterns;
    an insulating block (130-1) for accommodating one side of the pair of ferrite cores (110); and
    an insulating base (130-2) disposed at the inside of the pair of ferrite cores (110) in such a manner as to be fitted to the insulating block (130-1),
    wherein the insulating block (130-1) and the insulating base (130-2) accommodate a given region of the printed circuit board (120) on one side where the secondary via holes (123) are formed.

2. The planar transformer according to claim 1, wherein the insulating base (130-2) comprises:
    a first insulating base surface (135) coming into contact with middle legs (112) of the pair of ferrite cores (110); and
    second insulating base surfaces (136) extended from the first insulating base surface (135) in such a manner as to come into contact with top and underside of the printed circuit board (120).

3. The planar transformer according to claim 2, wherein the insulating block (130-1) comprises first insulating block surfaces 137 inserted into one side of the pair of ferrite cores (110) in such a manner as to be fitted to the second insulating base surfaces (136).

4. The planar transformer according to claim 3, wherein the insulating block (130-1) further comprises a second insulating block surface (138) inserted into one side of the pair of ferrite cores (110) in such a manner as to accommodate given portions of the exposed surfaces of the upper core (110-1) and the lower core (110-2) to the outside.

5. The planar transformer according to claim 3, wherein the upper core (110-1) and the lower core (110-2) each comprise an accommodation surface (116) formed on the inner side surface onto which the printed circuit board (120) is located in such a manner as to seat the second insulating base surfaces (136) and the first insulating block surfaces (137) fitted to each other thereonto.

6. The planar transformer according to claim 4, wherein shortest linear distance from the outer surfaces of the middle legs (112) to the secondary via holes (123) is shorter than 7 mm.

7. The planar transformer according to claim 4, wherein the insulating block (130-1) further comprises a third insulating block surface (139) adapted to connect the first insulating block surfaces (137) and the second insulating block surface (138) to each other, and the third insulating block surface (139) has a hole (139-1) formed thereon to allow a given region of the printed circuit board (120) on which the secondary via holes (123) are formed to be exposed to the outside of the pair of ferrite cores (110).

* * * * *